US011287451B2

(12) United States Patent
Tamura et al.

(10) Patent No.: US 11,287,451 B2
(45) Date of Patent: Mar. 29, 2022

(54) CURRENT SENSOR

(71) Applicant: Alps Alpine Co., Ltd., Tokyo (JP)

(72) Inventors: Manabu Tamura, Miyagi-ken (JP); Naoki Yamamoto, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/899,322

(22) Filed: Jun. 11, 2020

(65) Prior Publication Data
US 2020/0300896 A1 Sep. 24, 2020

Related U.S. Application Data

(63) Continuation of application No. PCT/JP2018/045575, filed on Dec. 11, 2018.

(30) Foreign Application Priority Data

Dec. 13, 2017 (JP) .............................. JP2017-238494

(51) Int. Cl.
*G01R 15/00* (2006.01)
*G01R 15/20* (2006.01)
*G01R 19/00* (2006.01)

(52) U.S. Cl.
CPC ....... *G01R 15/207* (2013.01); *G01R 19/0092* (2013.01)

(58) Field of Classification Search
CPC ... G01R 15/207; G01R 15/20; G01R 19/0092
See application file for complete search history.

(56) References Cited

U.S. PATENT DOCUMENTS

| 8,237,435 B2 | 8/2012 | Hashio et al. |
| 2011/0068771 A1* | 3/2011 | Ueno ................... G01R 15/202 324/117 R |

(Continued)

FOREIGN PATENT DOCUMENTS

| JP | 67072-1993 | 9/1993 |
| JP | 2010-230329 | 10/2010 |

(Continued)

OTHER PUBLICATIONS

International Search Report and Written Opinion from corresponding international application No. PCT/JP2018/045575, 8pgs, dated Mar. 12, 2019.

*Primary Examiner* — Dominic E Hawkins
(74) *Attorney, Agent, or Firm* — Crowell & Moring LLP

(57) ABSTRACT

A current sensor sending an output to the outside through a connector does not affect the precision of the sensor even when an external connector is inserted or removed. The current sensor has a bus bar and a case housing part of the bus bar. The case has an open upper surface and a lid covering the upper surface. A circuit board is fixed to the case body with three caulking portions. The circuit board includes a fixed area enclosed by these caulking portions and an extended portion extending from two of these caulking portions. The lid is provided with two lid-side stoppers. Inside the case body, case-body-side stoppers are provided at three positions. When an external connector is connected to or removed from the connector, the warp of the extended portion is suppressed by the case-body-side stoppers and lid-side stoppers.

4 Claims, 5 Drawing Sheets

(56) References Cited

U.S. PATENT DOCUMENTS

| | | | | |
|---|---|---|---|---|
| 2013/0015842 A1* | 1/2013 | Kawaguchi | ........ | G01R 31/2829 |
| | | | | 324/200 |
| 2013/0162246 A1* | 6/2013 | Nakajima | ............ | G01R 15/207 |
| | | | | 324/252 |
| 2014/0225593 A1* | 8/2014 | Nakajima | .............. | G01R 15/20 |
| | | | | 324/117 R |
| 2014/0253100 A1* | 9/2014 | Lepine | ................. | G01R 15/207 |
| | | | | 324/126 |
| 2015/0212117 A1* | 7/2015 | Hackner | ............. | G01R 15/207 |
| | | | | 324/117 H |
| 2015/0260762 A1* | 9/2015 | Sakamoto | ................ | G01R 1/18 |
| | | | | 324/117 R |

FOREIGN PATENT DOCUMENTS

| | | |
|---|---|---|
| JP | 2010-243440 | 10/2010 |
| JP | 2013-113631 | 6/2013 |
| JP | 2015-145839 | 8/2015 |
| WO | WO 2018/012034 | 1/2018 |

* cited by examiner

CURRENT SENSOR

CLAIM OF PRIORITY

This application is a Continuation of International Application No. PCT/JP2018/045575 filed on Dec. 11, 2018, which claims benefit of priority to Japanese Patent Application No. 2017-238494 filed on Dec. 13, 2017. The entire contents of each application noted above are hereby incorporated by reference.

BACKGROUND

1. Field of the Disclosure

The present disclosure relates to a current sensor that calculates a current value according to a magnetic field generated by a current under measurement.

2. Description of the Related Art

Japanese Unexamined Patent Application Publication No. 2017-102022 discloses a current sensor that that calculates a current value according to a magnetic field generated by a current. In the current sensor described in Japanese Unexamined Patent Application Publication No. 2017-102022, conductors in each of which a current under measurement flows and magnetic sensors each of which measures an induced magnetic field generated by the current under measurement are accommodated in a case having a lid. The current sensor has magnetic shields fixed by being integrally formed in the bottom and lid of the case.

In the current sensor in Japanese Unexamined Patent Application Publication No. 2017-102022, a connector mounted on a circuit board is exposed through an opening formed in a side wall of the case and an external connector is connected to the connector, so a signal from the magnetic sensor can be output to the outside.

The current sensor described in Japanese Unexamined Patent Application Publication No. 2017-102022 is formed so that a connector is provided at an end of the circuit board and a direction in which a connector on the other side to be connected is attached and the connected connector is removed is parallel to the surface of the circuit board. Therefore, even when the connector on the other side is inserted or removed, a large force is not applied in a direction perpendicular to the surface of the circuit board.

Depending on the current sensor, however, the connector may be mounted in a direction perpendicular to the surface of the circuit board due to a positional relationship of a device to be connected or for another reason. In this case, when the connector on the other side is inserted into or removed from the connector on the circuit board, a force is applied directly in a direction perpendicular to the surface of the circuit board. Therefore, the circuit board may be distorted.

If the circuit board is distorted as described above, a change may occur in a clearance between the conductor and a magnetic sensor mounted on the circuit board and a clearance between the magnetic sensor and the magnetic shield and the precision of the magnetic sensor may thereby be lowered.

SUMMARY

A current sensor is disclosed that does not affect precision of the sensor even when a connector on the other side is inserted or removed.

A current sensor includes a bus bar in which a current flows; a magnetic sensor that detects an induced magnetic field generated by the current flowing in the bus bar. An insulative circuit board is provided on which the magnetic sensor is mounted. A connector is mounted on the circuit board and connected to the magnetic sensor through the circuit board. The connector is capable of outputting a signal from the magnetic sensor to the outside. A case having a case body and a lid, houses the circuit board and part of the bus bar. The circuit board is fixed to the case body with a plurality of fixing portions, and the magnetic sensor is disposed in a fixed area enclosed by the plurality of fixing portions. The connector is disposed in an extended area extending from the fixed area. The case body has a stopper so as to face the rear surface of the extended portion through a gap, and the lid also has a stopper so as to face the front surface of the extended portion through a gap.

With the disclosed current sensor, the magnetic sensor is provided in the fixed area enclosed by a plurality of fixing portions, and the connector is provided in the extended area extending from the fixed area. A stopper is provided inside the case body so as to face the rear surface of the extended portion through a gap, and another stopper is provided inside the lid so as to face the front surface of the extended portion through a gap. Therefore, when a connector on the other side is inserted into or removed from the connector, the extended portion can be warped in the plate thickness direction only by an amount equal to the gap with respect to the stopper. Since the fixed area is enclosed by the plurality of fixing portions, the warp is suppressed. Therefore, no change occurs in a positional relationship between the bus bar and the magnetic sensor, so precision of the current sensor can be assured.

DESCRIPTION OF THE EXEMPLARY EMBODIMENTS

A current sensor, which is an example of an embodiment of the present invention, will be described with reference to FIGS. 1 to 6. The current sensor 1 in this embodiment is a sensor that can be used in a device requiring a large current such as a controller used in, for example, a hybrid vehicle or an electric car.

Figure 1:
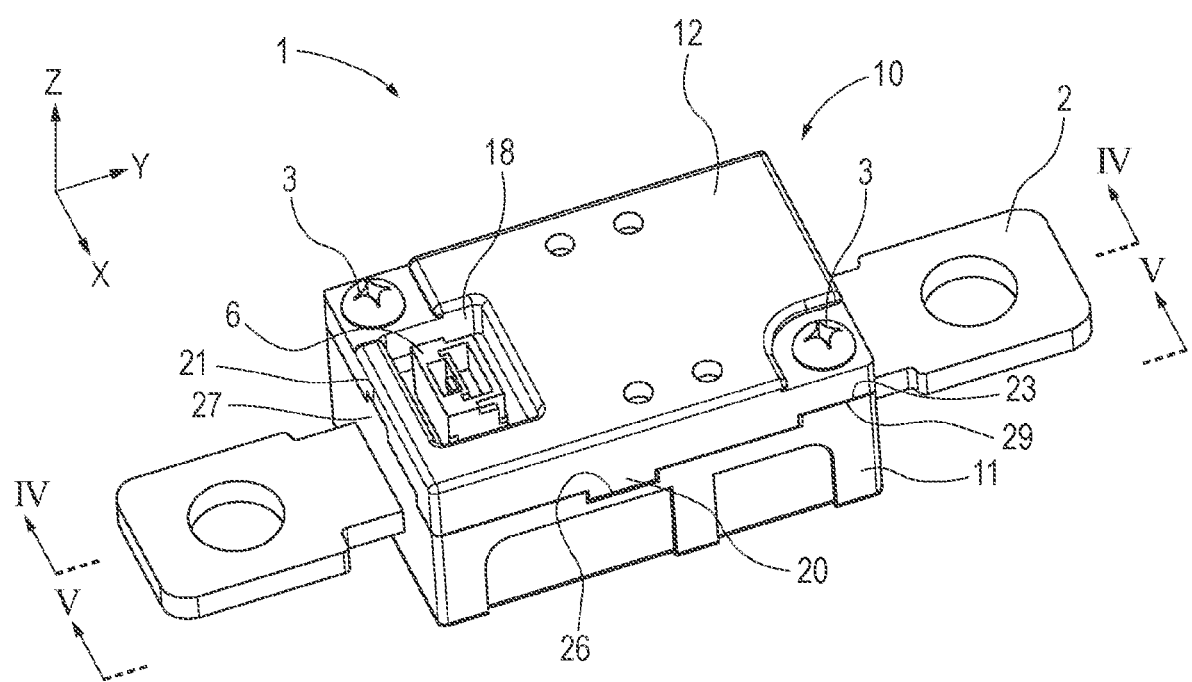
FIG. 1 is a perspective view illustrating the outside shape of a current sensor, which is an example of an embodiment of the present invention.
Figure 2:
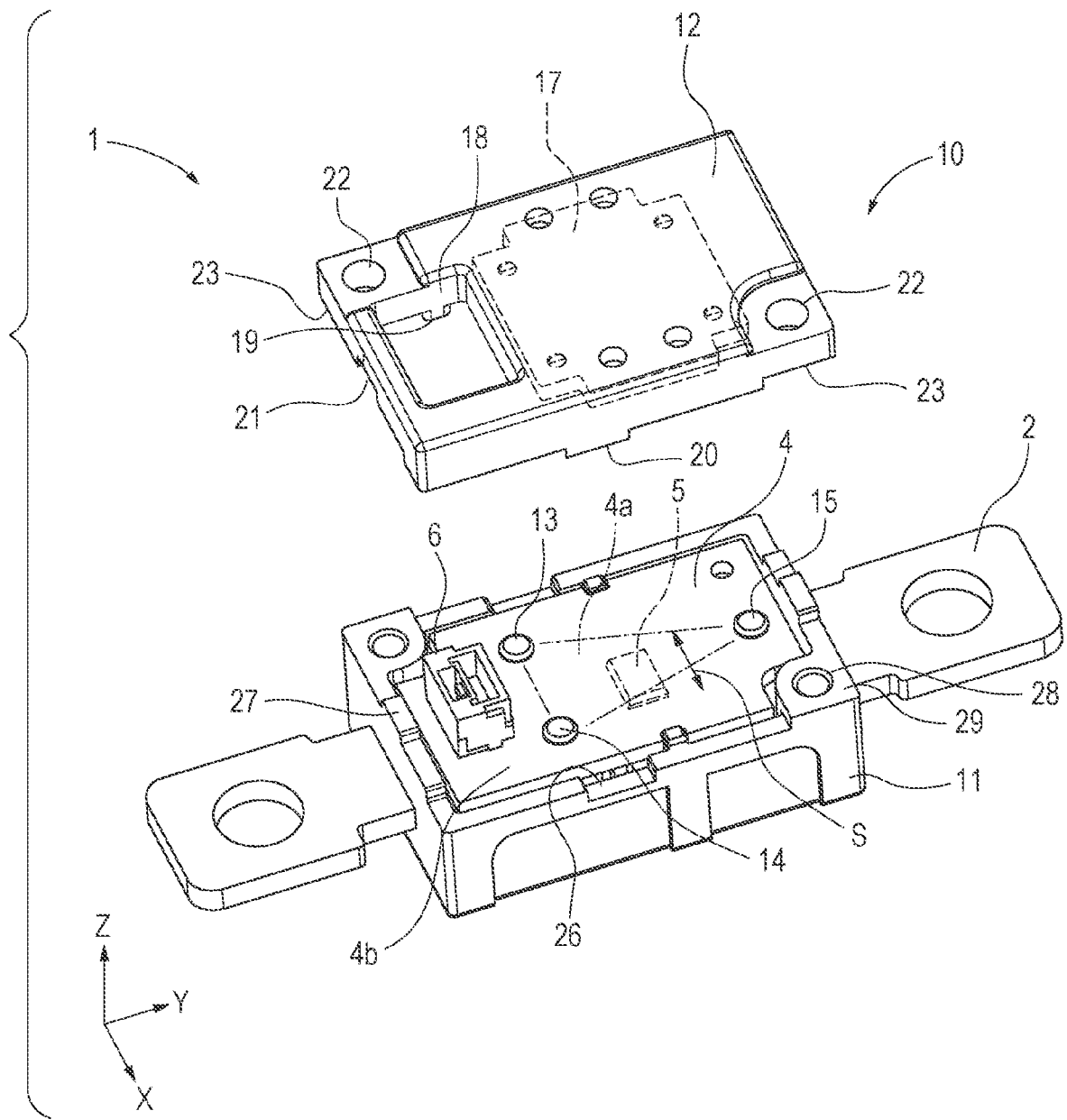
FIG. 2 is an exploded perspective view illustrating a state in which the lid of the current sensor in FIG. 1 is removed.
Figure 3:
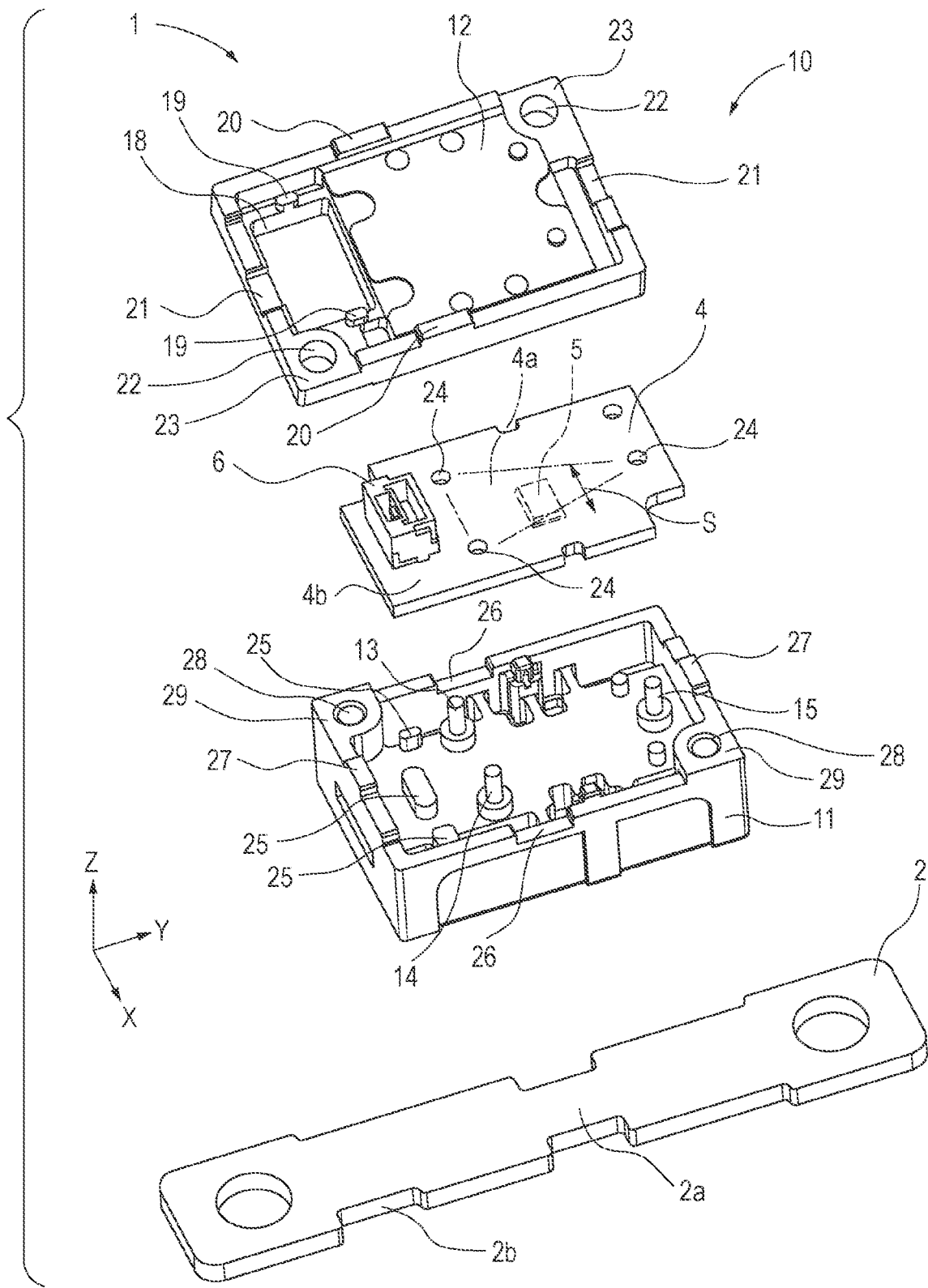
FIG. 3 is an exploded perspective view illustrating a state in which the current sensor in FIG. 2 is further disassembled and the lid is reversed.

FIG. 1 is a perspective view illustrating the outside shape of the current sensor 1, which is an example of an embodiment of the present invention. FIG. 2 illustrates a state in which the lid 12 of the current sensor 1 is removed. A lid-side magnetic shield 17 provided in the lid 12 and a magnetic sensor 5 provided on a circuit board 4 are illustrated by the dotted lines. FIG. 3 is an exploded view of the current sensor 1, illustrating a state in which a bus bar 2 is separated from a case body 11, the circuit board 4 is separated from the case body 11, and the lid 12 is reversed.

As illustrated in FIG. 1, the current sensor 1 in this embodiment has the bus bar 2 in which a current flows and a case 10 that houses part of the bus bar 2. As illustrated in FIG. 2, the case 10 is composed of the case body 11 in a box shape, the upper surface of which is open, and the lid 12 that covers the upper surface of the case body 11. The case body 11 and lid 12 are both made of an insulative synthetic resin. They are mutually fixed with two fixing screws 3.

Also, as illustrated in FIG. 2, the insulative circuit board 4, which is housed inside the case body 11, is fixed with caulking portions 13, 14, and 15 provided at three positions. These caulking portions 13, 14, and 15 are formed by making part of the case body 11 protrude in a columnar form, inserting the columnar portions into caulking holes 24, which will be described later, and thermally deforming the columnar portions from above. The caulking portions 13, 14, and 15 are equivalent to a plurality of fixing parts in the present invention.

In this embodiment, of the caulking portions 13, 14, and 15, the caulking portions 13 and 14 are aligned in the X direction in FIG. 2, and the caulking portion 15 is disposed at one position distant to the right of the caulking portions 13 and 14 in the Y direction. In this embodiment, the caulking portions 13 and 14 are each equivalent to a first fixing portion in the present invention, and the caulking portion 15 is equivalent to a second fixing portion in the present invention.

The caulking portion 15, which is the second fixing portion, is preferably disposed at a position opposite to the caulking portions 13 and 14, each of which is the first fixing portion, toward the Y direction with respect to the magnetic sensor 5. In the case body 11, a case-body-side magnetic shield 16 formed integrally with a resin is provided (see FIGS. 4 to 6).

In this embodiment, an area, on the circuit board 4, enclosed by the caulking portions 13, 14, and 15 at three positions is a fixed area 4a. On the circuit board 4, an area to the left of the caulking portions 13 and 14 in the Y direction in FIG. 2 is preferably an extended portion 4b extending from the fixed area 4a. That is, the extended portion 4b is preferably disposed with the caulking portions 13 and 14, equivalent to the first fixing portions, interposed between the fixed area 4a and the extended portion 4b. A connector 6, which will be described later, is preferably mounted on the extended portion 4b. Therefore, the connector 6 is mounted at a position at which the connector 6 does not overlap the fixed area 4a in the X direction, which is the direction of an induced magnetic field. Since the caulking portions 13 and 14 are aligned in a direction parallel to the short side of the circuit board 4, the extended portion 4b, on which the connector 6 is mounted, is likely to be bent.

The magnetic sensor 5 is mounted on the rear surface of the fixed area 4a on the circuit board 4. The magnetic sensor 5 detects an induced magnetic field generated by a current flowing in the bus bar 2. In this embodiment, the magnetic sensor 5 is preferably fixed to the circuit board 4 so that the sensitivity direction of the magnetic sensor 5 for the induced magnetic field matches the X direction, indicated by the arrow S in FIG. 2, of an XY plane.

The connector 6 is mounted on the front surface of the extended portion 4b on the circuit board 4. A conductive terminal (omitted in the drawing) provided in the connector 6 is connected to a circuit pattern (omitted in the drawing) provided on the circuit board 4 and is connected to the magnetic sensor 5 through the circuit board 4. The connector 6 is also connected to a connector (omitted in the drawing, also true hereinafter) of another device so that a signal from the magnetic sensor 5 can be output to the outside of the case 10.

As illustrated in FIG. 2, a metallic lid-side magnetic shield 17 is preferably provided in the lid 12. In this embodiment, when the lid 12 is formed, the lid-side magnetic shield 17 is placed in a mold (omitted in the drawing, also true hereinafter) for injection molding and is mold integrally with a resin, which is a raw material. In the lid 12, a connector opening 18 is formed through which the connector 6 is exposed to the outside.

In the lid 12, two lid-side stoppers 19 (a type of stopper) are provided in the vicinity of the connector opening 18 on the rear surface side, as illustrated in FIG. 3. A Y-direction positioning protrusion 20 is provided at two positions on outer walls enclosing the circumference on the rear surface side of the lid 12. The Y-direction positioning protrusion 20 is used for positioning in the Y direction with respect to the case body 11.

Similarly, an X-direction positioning recess 21 is provided at two positions in the Y direction of the outer walls. The X-direction positioning recess 21 is used for positioning in the X direction. On the rear side of the lid 12, a lid-side Z-direction positioning portion 23 is provided in the vicinity of each insertion hole 22 into which the fixing screw 3 is inserted. The lid-side Z-direction positioning portion 23 is used for positioning in the Z direction.

As illustrated in FIG. 3, the circuit board 4 is an insulative plate member in a substantially quadrangle shape, and caulking holes 24 through which the caulking portions 13, 14, and 15 disposed inside the case body 11 are passed are formed on the circuit board 4 at three positions.

Inside the case body 11, a case-body-side stopper 25 (a type of stopper) facing the rear surface of the circuit board 4 is provided at three positions. In FIG. 3, the caulking portions 13, 14, and 15 yet to be caulked to the circuit board 4 are illustrated, so they are in a columnar shape so that they can be passed through the caulking holes 24 in the circuit board 4.

Outer wall portions of the case body 11 have a Y-direction positioning recess 26 used for positioning in the Y direction at two positions, and also have an X-direction positioning protrusions 27 used for positioning in the X direction at two positions. In the vicinity of each screw hole 28 in which the fixing screw 3 is fastened, a body-side Z-direction positioning portion 29 used for positioning in the Z direction is formed.

The bus bar 2 is a plate-like member extending in the Y direction. A to-be-detected portion 2a facing the magnetic sensor 5 is formed so that the width in X direction is narrower than the other portions. A cutout 2b is formed in one side edge of the bus bar 2. This cutout 2b is used for positioning by using a positioning protrusion (omitted in the drawing) of the mold for injection molding when the bus bar 2 is formed integrally inside the case body 11. This prevents the bus bar 2 from being attached to the case body 11 in the opposite direction.

Figure 4:
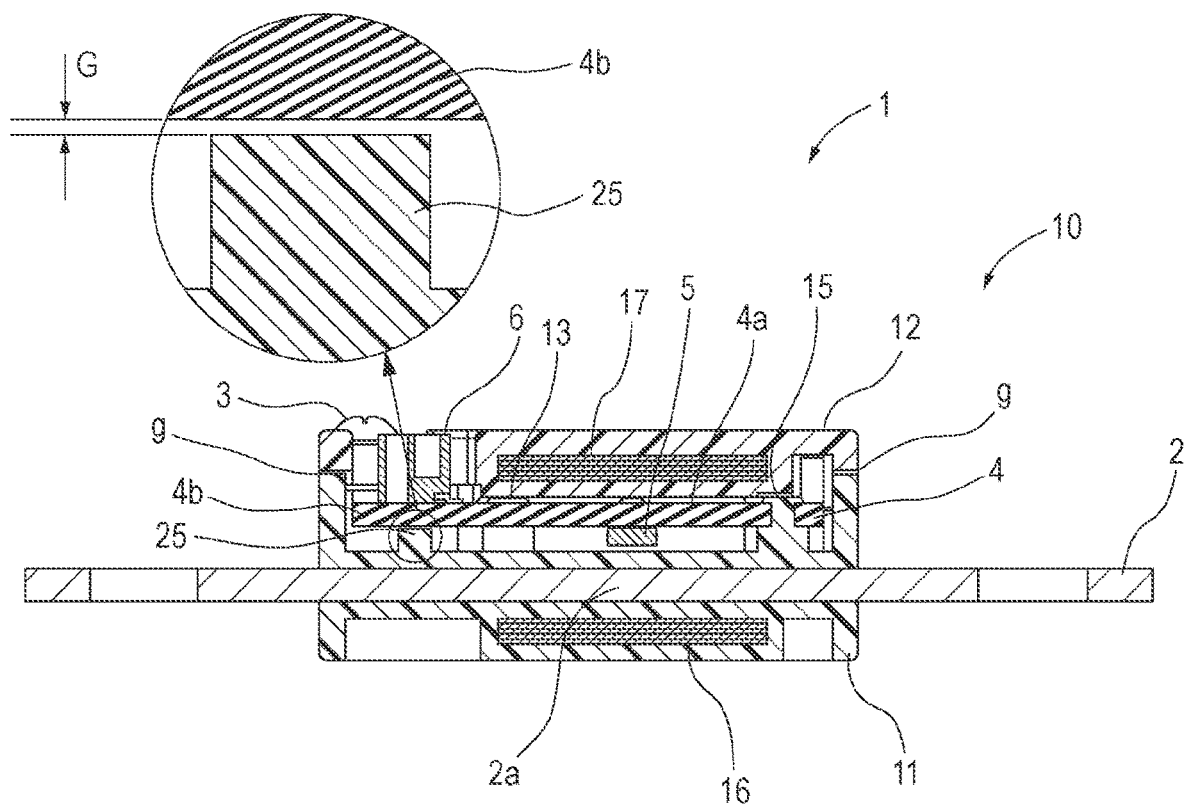
FIG. 4 is a cross-sectional view of the current sensor in FIG. 1 as taken along line IV-IIV.
Figure 5:
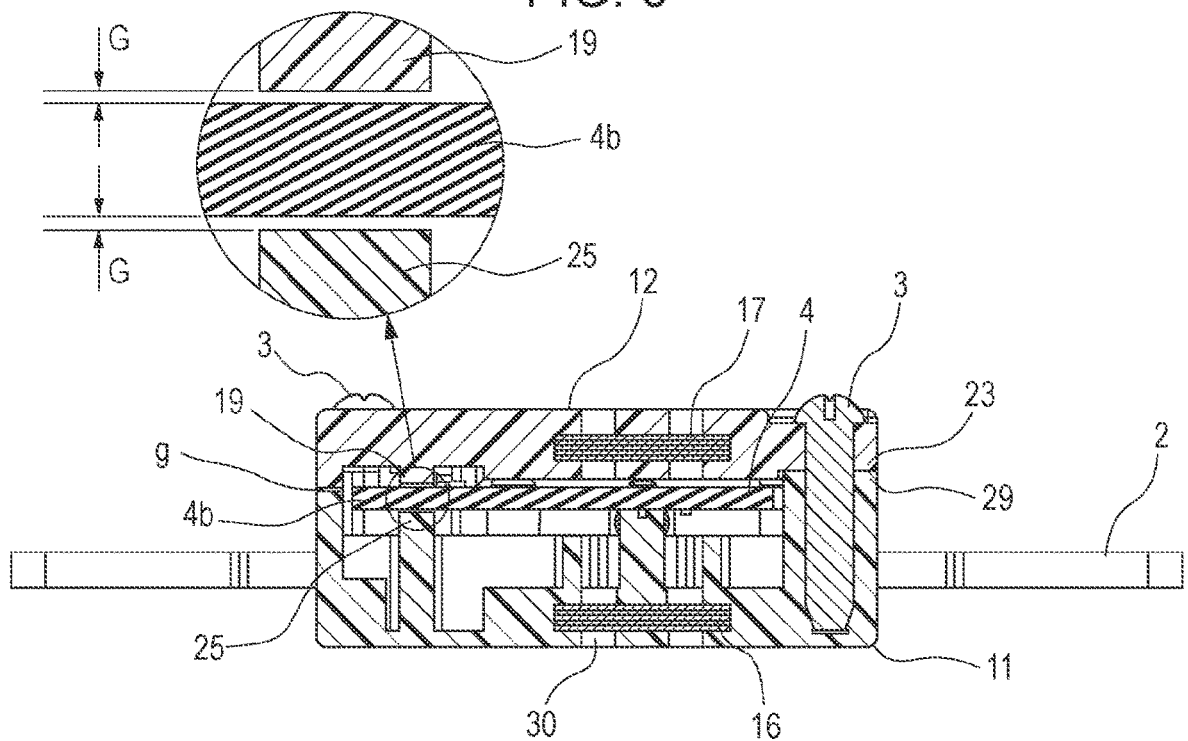
FIG. 5 is a cross-sectional view of the current sensor in FIG. 1 as taken along line V-IV.

Next, the internal structure of the current sensor 1 in this embodiment will be described with reference to FIGS. 4 and 5. FIG. 4 is a cross-sectional view along line IV-IIV in FIG. 1 at the center position of the current sensor 1 in the X direction. FIG. 5 is a cross-sectional view along line V-IV closer to the outer wall at front than in FIG. 4.

As illustrated in FIG. 4, the circuit board 4 is positioned and fixed to the case body 11 with the caulking portions 13 and 15. On the rear surface of the circuit board 4, the magnetic sensor 5 is mounted in the fixed area 4a. On the front surface, the connector 6 is mounted in the extended portion 4b. On the rear surface of the extended portion 4b on the circuit board 4, the case-body-side stopper 25 is placed so as to face the extended portion 4b with a gap G left therebetween.

On the front surface side of the extended portion 4b on the circuit board 4, the lid-side stopper 19 is placed so as to face the extended portion 4b with the gap G left therebetween, as illustrated in FIG. 5. As described above, on the rear surface side of the extended portion 4b on the circuit board 4, the case-body-side stopper 25 is placed so as to face the extended portion 4b with the gap G left therebetween.

In this embodiment, the minimum value of this gap G is set so that in consideration of the dimensional tolerances of the lid-side stopper 19, case-body-side stopper 25, and circuit board 4, even when the lid-side stopper 19 or case-body-side stopper 25 comes closest to the circuit board 4, the gap G does not become smaller than zero.

The maximum value of the gap G is set to a value enough to prevent a change in an output from the magnetic sensor 5 due to a positional relationship among the magnetic sensor 5, the caulking portions 13, 14, and 15, and the connector 6 on the circuit board 4 even when the extended portion 4b is warped. In this embodiment, the gap G is set so that it falls within a range from 0 mm to 0.1 mm.

At positions on the outer walls of the lid 12 and case body 11, the lid-side Z-direction positioning portion 23 and body-side Z-direction positioning portion 29 abut each other as illustrated in FIG. 5 to position the lid 12 and case body 11 in the Z direction. At other positions, a gap g is formed between the outer wall portions of the lid 12 and case body 11.

The lid 12 and case body 11 are positioned in the X direction by fitting the X-direction positioning protrusions 27 formed on the case body 11 into the X-direction positioning recesses 21 formed in the lid 12, as illustrated in FIG. 1. Similarly, positioning in the Y direction is performed by fitting the Y-direction positioning protrusions 20 formed on the lid 12 into the Y-direction positioning recesses 26 formed in the case body 11.

Figure 6:
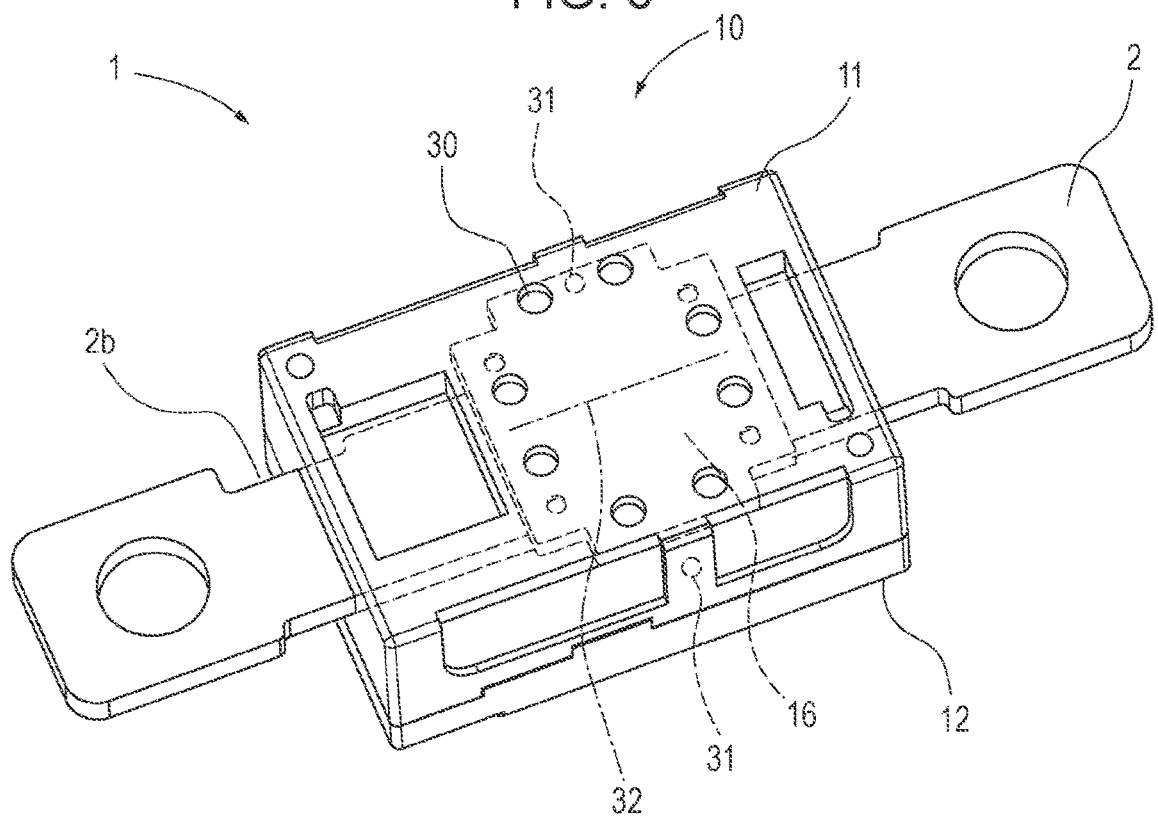
FIG. 6 is a perspective view illustrating a state as viewed from the rear side of the current sensor in FIG. 1.

FIG. 6 is a perspective view when the current sensor 1 in this embodiment is viewed from rear surface side. In the rear surface of the case body 11, a recess 30 is formed by a shield pressing portion (omitted in the drawing) provided in the mold for injection molding when the case-body-side magnetic shield 16 is molded integrally in the case body 11. In this embodiment, a total eight recesses 30 are formed, two for each of the four edges of the case-body-side magnetic shield 16.

In FIG. 6, each circle illustrated by a dotted line on a side surface of the case body 11 indicates a gate position 31 of the mold for injection molding. Also, in FIG. 6, the dash-dot line extending in the Y direction at the center of the case-body-side magnetic shield 16 is a so-called weld line 32 on a resin. When the current sensor 1 is in the form of a product, however, this weld line 32 does not appear on the front surface.

In this embodiment, the recesses 30 formed when the case-body-side magnetic shield 16 is supported in the mold for injection molding are provided separately in two areas deviated from the weld line 32 in the X direction. In this structure, therefore, even if the case body 11 is distorted and a stress is thereby generated in the weld line 32, cracks are not easily generated from the weld line 32.

Since the current sensor 1 in this embodiment has the structure described above, when a connector of another device is inserted into the connector 6, the connector 6 is pressed against the circuit board 4 in the Z direction. At this time, the extended portion 4b on the circuit board 4 is warped downward in the Z direction with the line interconnecting the caulking portions 13 and 14, which are the first fixing portion, taken as the boundary.

Since three body-side stoppers 25 are provided on the rear surface side of the extended portion 4b as illustrated in FIG. 3, even if the extended portion 4b is warped as described above, the amount of warp is restricted to the gap G due to the body-side stoppers 25. After the connector of the other device has been attached, the extended portion 4b returns to the previous position due to its elasticity, eliminating the warp of the circuit board 4.

At this time, the fixed area 4a, enclosed by the caulking portions 13, 14, and 15, on the circuit board 4 is slightly affected by the warp of the extended portion 4b. However, after the connector of the other device has bee attached, the warp of the extended portion 4b is eliminated, so the effect does not remain in the positional relationship between the magnetic sensor 5 mounted on the fixed area 4a and the to-be-detected portion 2a of the bus bar 2.

The direction in which the caulking portions 13 and 14 are aligned in the X direction matches the sensitivity direction S of the magnetic sensor 5. Therefore, even if the position of the fixed area 4a, in which the magnetic sensor 5 is mounted, is slightly changed due to the effect caused in the connector 6, the sensitivity direction S of the magnetic sensor 5 remains unchanged. Thus, there is no practical effect on the sensitivity of the magnetic sensor 5.

As described above, with the current sensor 1 in this embodiment, the magnetic sensor 5 is not affected by the insertion or removal of a connector of another device into or from the connector 6, or even if the magnetic sensor 5 is affected, the magnetic sensor 5 is not practically affected. Therefore, the precision of the current sensor 1 can be stably maintained.

In the above embodiment, to suppress the warp of the extended portion 4b, the gap G between the circuit board 4 and the lid-side stopper 19 and the gap G between the circuit board 4 and the case-body-side stopper 25 is preferably small. However, it is necessary to prevent the gap G from being reduced below zero even if the gap G is minimized due to the dimensional tolerances of individual members. This is because if the gap G becomes negative, the lid-side stopper 19 or case-body-side stopper 25 is kept in contact with the circuit board 4, placing the circuit board 4 in a deformed state, so the extended portion 4b is warped and the position of the magnetic sensor 5 in the fixed area 4a is also affected.

In the above embodiment, the fixing portions that fix the circuit board 4 to the case body 11 are the caulking portions 13 and 14 provided as the first fixing portions, and the caulking portion 15 provided as the second fixing portion. When the fixed area 4a is defined with three caulking portions 13, 14, and 15 in this way, the fixed area 4a becomes triangular and thereby becomes less likely to be externally affected.

In the above embodiment, although the caulking portions 13, 14, and 15 are set at three positions, this is not a limitation. Caulking portions may be set at four or more positions. Also, in the above embodiment, although the gap G between the circuit board 4 and the lid-side stopper 19 and the gap G between the circuit board 4 and the case-body-side stopper 25 have the same value, this is not a limitation. Different dimensions may be set for these gaps G.

The case 10 is composed of two members, lid 12 and case body 11, and the lid 12 is formed so as to have a smaller thickness than the case body 11. However, the lid 12 may be thicker than the case body 11 without being limited to the shape in the above embodiment.

Also, in the above embodiment, although the fixing portions that fix the circuit board 4 and case body 11 together are the caulking portions 13, 14, and 15, this is not a limitation. Press fitting the caulking hole 24 to a columnar portion formed inside the case body 11 may be performed. Alternatively, other fixing methods such as screwing or riveting may be used.

Also, in the above embodiment, although each stopper is formed by a protrusion in an elliptical shape, this is not a limitation. Other shapes such as a columnar shape and prismatic shape suffice if they can minimize the warp of the circuit board 4.

Also, in the above embodiment, the lid-side magnetic shield 17 is fixed by being formed integrally in the lid 12, and the case-body-side magnetic shield 16 is fixed by being formed integrally in the case body 11 and are fixed. However, this is not a limitation. The lid-side magnetic shield 17 and case-body-side magnetic shield 16 may be fixed by using caulking portions as with the circuit board 4 or in another fixing method.

What is claimed is:

1. A current sensor comprising:
   a bus bar;
   a magnetic sensor that detects an induced magnetic field generated by a current flowing in the bus bar;
   an insulative circuit board on which the magnetic sensor is mounted;
   a connector mounted on the circuit board and connected to the magnetic sensor through the circuit board, the connector outputting a signal from the magnetic sensor to an outside; and
   a case having a case body and a lid, the case housing the circuit board and part of the bus bar; wherein:
   the circuit board is fixed to the case body with a plurality of fixing portions, and the magnetic sensor is disposed in a fixed area enclosed by the plurality of fixing portions;
   the connector is disposed in an extended area extending from the fixed area;
   the case body has a stopper that faces the rear surface of the extended portion through a gap, and the lid has a stopper that faces the front surface of the extended portion through a gap;
   the magnetic sensor is placed so that a sensitivity direction for the induced magnetic field matches an X direction in an XY plane; and
   of the plurality of fixing portions, a first fixing portion placed between the magnetic sensor and the connector is placed at two positions in the X direction.

2. The current sensor according to claim 1, wherein the extended portion in which the connector is provided is adjacent to the fixed area with the first fixing portions interposed between the extended portion and the fixed area.

3. The current sensor according to claim 1, wherein the fixing portions include a second fixing portion at one position opposite to the first fixing portions toward the Y direction with respect to the magnetic sensor.

4. The current sensor according to claim 1, wherein a magnetic shield is provided in the lid.

* * * * *